United States Patent
Bunce et al.

(10) Patent No.: US 7,085,173 B1
(45) Date of Patent: Aug. 1, 2006

(54) WRITE DRIVER CIRCUIT FOR MEMORY ARRAY

(75) Inventors: Paul A. Bunce, Poughkeepsie, NY (US); John D. Davis, Wallkill, NY (US); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/054,270

(22) Filed: Feb. 9, 2005

(51) Int. Cl.
*G11C 7/10* (2006.01)

(52) U.S. Cl. .......................... 365/189.06; 365/189.01; 365/190

(58) Field of Classification Search ................ None
See application file for complete search history.

(56) References Cited

U.S. PATENT DOCUMENTS

| | | | | |
|---|---|---|---|---|
| 5,570,319 A | * | 10/1996 | Santoro et al. | 365/230.03 |
| 5,659,512 A | * | 8/1997 | Koyanagi et al. | 365/203 |
| 5,668,761 A | | 9/1997 | Muhich et al. | |
| 5,675,529 A | * | 10/1997 | Poole | 365/63 |
| 5,734,613 A | * | 3/1998 | Gibson | 365/189.04 |
| 5,850,367 A | * | 12/1998 | Wada et al. | 365/230.03 |
| 5,986,914 A | * | 11/1999 | McClure | 365/63 |
| 6,088,276 A | * | 7/2000 | Ukita | 365/207 |
| 6,288,969 B1 | * | 9/2001 | Gibbins et al. | 365/230.05 |
| 6,426,905 B1 | * | 7/2002 | Dennard et al. | 365/204 |
| 6,657,886 B1 | | 12/2003 | Adams et al. | |
| 6,665,209 B1 | * | 12/2003 | Osada et al. | 365/154 |
| 6,888,770 B1 | * | 5/2005 | Ikehashi | 365/205 |
| 6,901,003 B1 | | 5/2005 | Adams et al. | |
| 2004/0027885 A1 | | 2/2004 | Buettner et al. | |

* cited by examiner

*Primary Examiner*—Son Mai
(74) *Attorney, Agent, or Firm*—Lynn Augspurger; Cantor Colburn LLP

(57) ABSTRACT

Embodiments of the invention include a circuit for interfacing local bitlines to a global bitline. The circuit includes an interface line coupled to a local bitline through a local bitline device. A global output device has an input coupled to the interface line and an output coupled to the global bitline. A clamping device is coupled to the interface line, the clamping device coupling the interface line to ground in response to a data in signal. A memory having the circuit is also disclosed.

12 Claims, 6 Drawing Sheets

WRITE DRIVER CIRCUIT FOR MEMORY ARRAY

FIELD OF THE INVENTION

This invention relates to accessing memory arrays, and in particular, to a write driver circuit for a memory array.

BACKGROUND

FIGS. 1A and 1B illustrate a high performance, low power domino SRAM design including multiple local cell groups such as that shown in U.S. Pat. No. 6,657,886, the entire contents of which are incorporated herein by reference. As shown in FIG. 1A, each cell group includes multiple SRAM cells 1–N and local true and complement bitlines LBLT and LBLC. Each SRAM cell includes a pair of inverters that operate together in a loop to store true and complement (T and C) data. The local true bitline LBLT and the local complement bitline LBLC are connected to each SRAM cell by a pair of wordline N-channel field effect transistors (NFETs) to respective true and complement sides of the inverters. A WORDLINE provides the gate input to wordline NFETs. A particular WORDLINE is activated, turning on respective wordline NFETs to perform a read or write operation.

As shown in FIG. 1B, the prior art domino SRAM includes multiple local cell groups 1–M. Associated with each local cell group are precharge true and complement circuits coupled to the respective local true and complement bitlines LBLT and LBLC, write true and write complement circuits, and a local evaluate circuit. Each of the local evaluate circuits is coupled to a global bitline labeled 2ND STAGE EVAL and a second stage inverter that provides output data or is coupled to more stages. A write predriver circuit receiving input data and a write enable signal provides write true WRITE T and write complement WRITE C signals to the write true and write complement circuits of each local cell group.

A read occurs when a wordline is activated. Since true and complement (T and C) data is stored in the SRAM memory cell, either the precharged high true local bitline LBLT will be discharged if a zero was stored on the true side or the precharged high complement bitline LBLC will be discharged if a zero was stored on the complement side. The local bitline, LBLT or LBLC connected to the one side will remain in its high precharged state. If the true local bitline LBLT was discharged then the zero will propagate through one or more series of domino stages eventually to the output of the SRAM array. If the true local bitline was not discharged then no switching through the domino stages will occur and the precharged value will remain at the SRAM output.

To perform a write operation, the wordline is activated as in a read. Then either the write true WRITE T or write complement WRITE C signal is activated which pulls either the true or complement local bitline low via the respective write true circuit or write complement circuit while the other local bitline remains at its precharged level, thus updating the SRAM cell.

During a write operation, the wordline is activated as in a read. The cell will begin to discharge the bitline corresponding to the side of the cell that has a zero stored. If the write operation is meant to change the state of the cell, the write circuit will discharge the bitline opposite of the one that the cell has begun to discharge. Thus the bitline being discharged by the cell can trigger a read before the cell is updated by the write operation, particularly if the write circuit response is slow. Such an occurrence can produce inaccurate results and is referred to as a false read. There is a need in the art for a circuit for driving write operations that also suppresses false reads.

SUMMARY OF THE INVENTION

Embodiments of the invention include a circuit for interfacing local bitlines to a global bitline. The circuit includes an interface line coupled to a local bitline through a local bitline device. A global output device has an input coupled to the interface line and an output coupled to the global bitline. A clamping device is coupled to the interface line, the clamping device coupling the interface line to ground in response to a data in signal. A memory having the circuit is also disclosed.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1A:
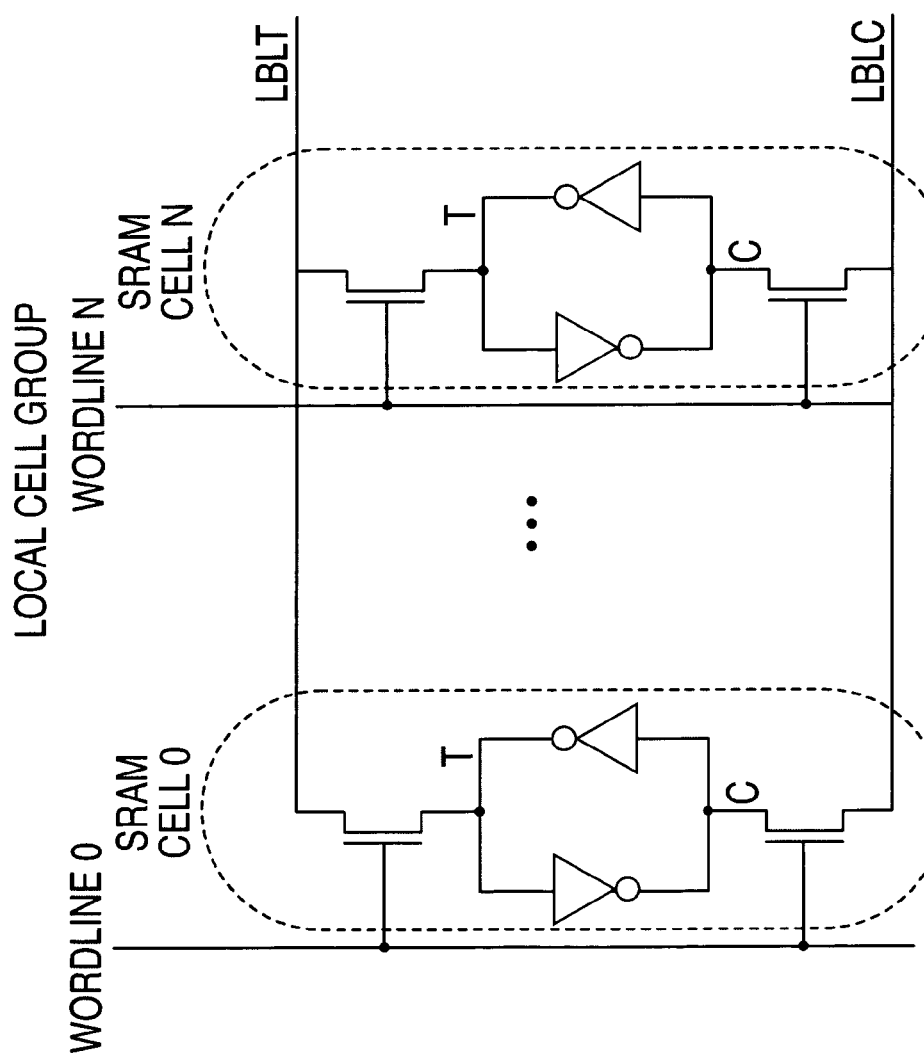
FIG. 1A illustrates an exemplary conventional SRAM cell.
Figure 1B:
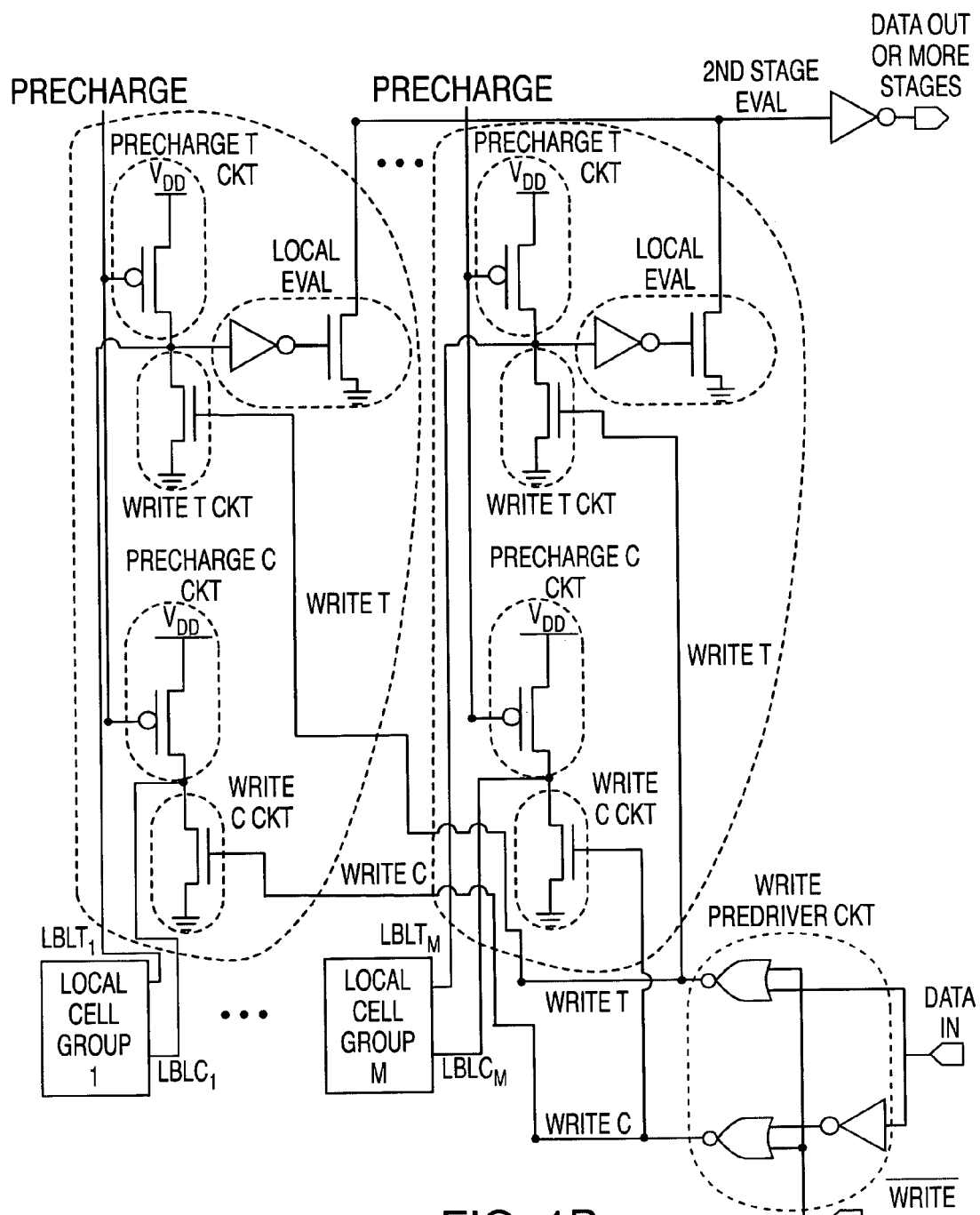
FIG. 1B illustrates an exemplary domino SRAM.
Figure 2:
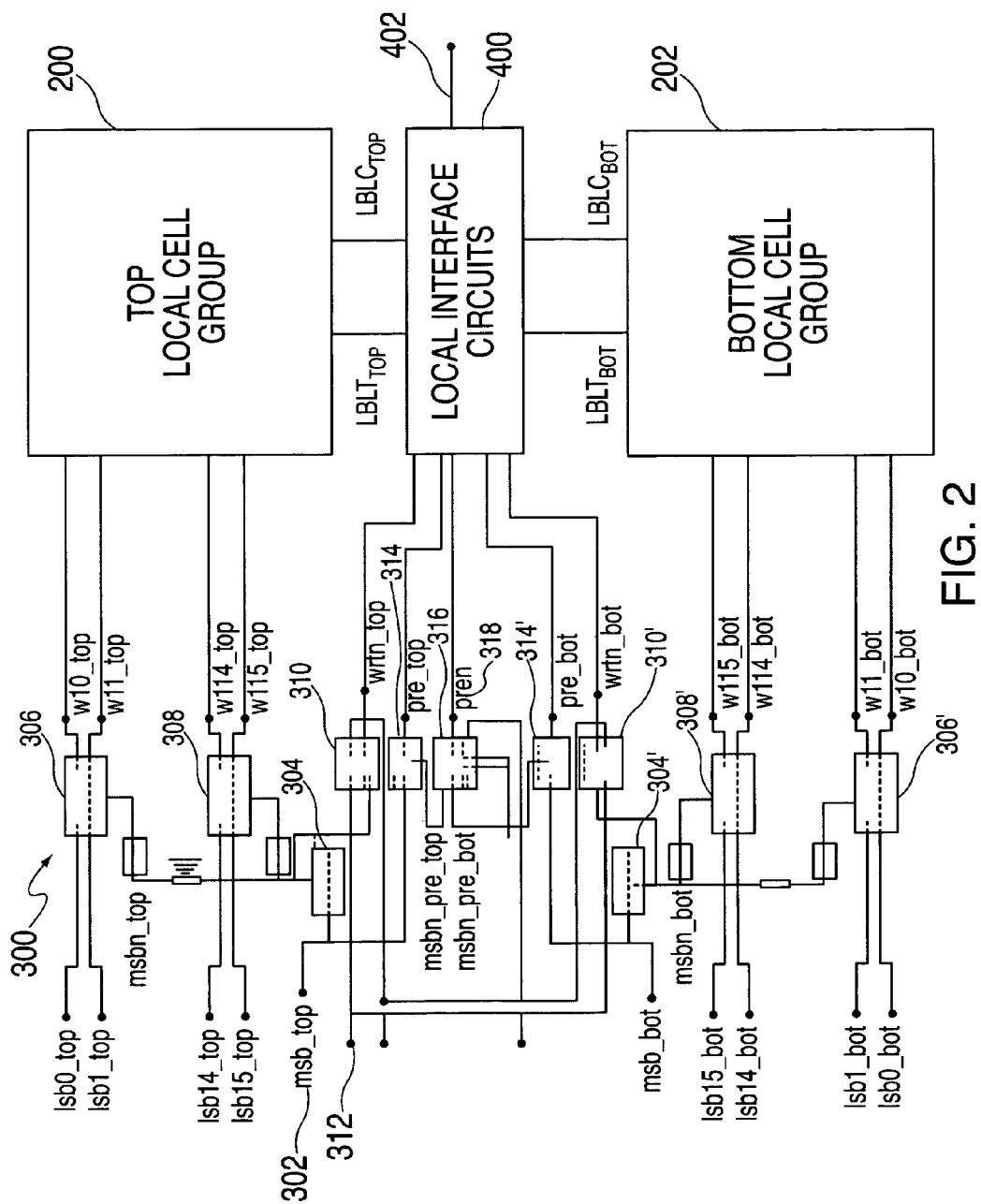
FIG. 2 is a block diagram of a synchronization circuit for use with a memory array.

FIG. 2 is a block diagram of a synchronization circuit 300 for use with a memory array. The synchronization circuit 300 is divided into a top and bottom portion, corresponding to the top local cell group 200 and the bottom local cell group 202 of a memory array that is divided into a top sub-array and a bottom sub-array. Local interface circuits 400 access the top local cell group 200 or the bottom local cell group 202 over bitlines LBLTtop, LBLCtop, LBLTbot and LBLCbot and output a global bitline 402.

Operation of the synchronization circuit 300 will be made with reference to the top portion, with corresponding elements in the bottom portion operating in the same manner. The synchronization circuit 300 generates a number of array signals in response to a synchronization signal. In the embodiment of FIG. 2, the synchronization signal is a most significant bit signal 302 labeled msb_top. The most significant bit signal 302 is from a decoded address word.

The most significant bit signal 302 is provided to an inverter 304 that generates the compliment of the most significant bit signal 302, labeled msbn_top. The compliment of the most significant bit signal 302 is provided to word drivers 306 and 308 to enable the generation of wordline select signals output by word drivers 306 and 308. The wordline signal is the row access signal that activates memory cells in top local cell group 200. The wordline drivers 306 and 308 are described in further detail with reference to FIG. 3.

The compliment of the most significant bit signal 302, labeled msbn_top, is also provided to a write driver 310. The write driver 310 generates a write signal based on the compliment of the most significant bit signal 302 and an external write enable signal 312 labeled. The write driver 310 is an AND of a write enable signal 312 with msbn_top. The write driver 310 outputs a write enable signal labeled wrtn_top. The write enable signal is a row signal that enables (e.g., low) or disables (e.g., high) a write operation.

The most significant bit signal 302 is also provided to a buffer 314 that outputs a local precharge signal, labeled pre_top. A low logic level on the local precharge signal precharges the local bitlines to their standby state. A high logic level on the local precharge signal turns off the precharge and allows the bitlines to be driven by the cell (for a read) or a data driver (for a write).

The buffer 314 also outputs a compliment of the most significant bit signal, labeled msbn_pre_top. The compliment of the most significant bit signal is generated by an inverter stage in buffer 314. The compliment of the most significant bit signal is provided to a local precharge logic 316, which generates a second precharge signal 318. This precharge signal is a memory array row signal for regulating read operations. The local precharge logic performs an AND operation between the top compliment of the most significant bit signal and the bottom compliment of the most significant bit signal which is generated at buffer 314'. In an alternate embodiment, the msbn_top signal from inverter 304 is input to the precharge logic 316. This eliminates the need to generate the msbn_pre_top signal.

Figure 3:
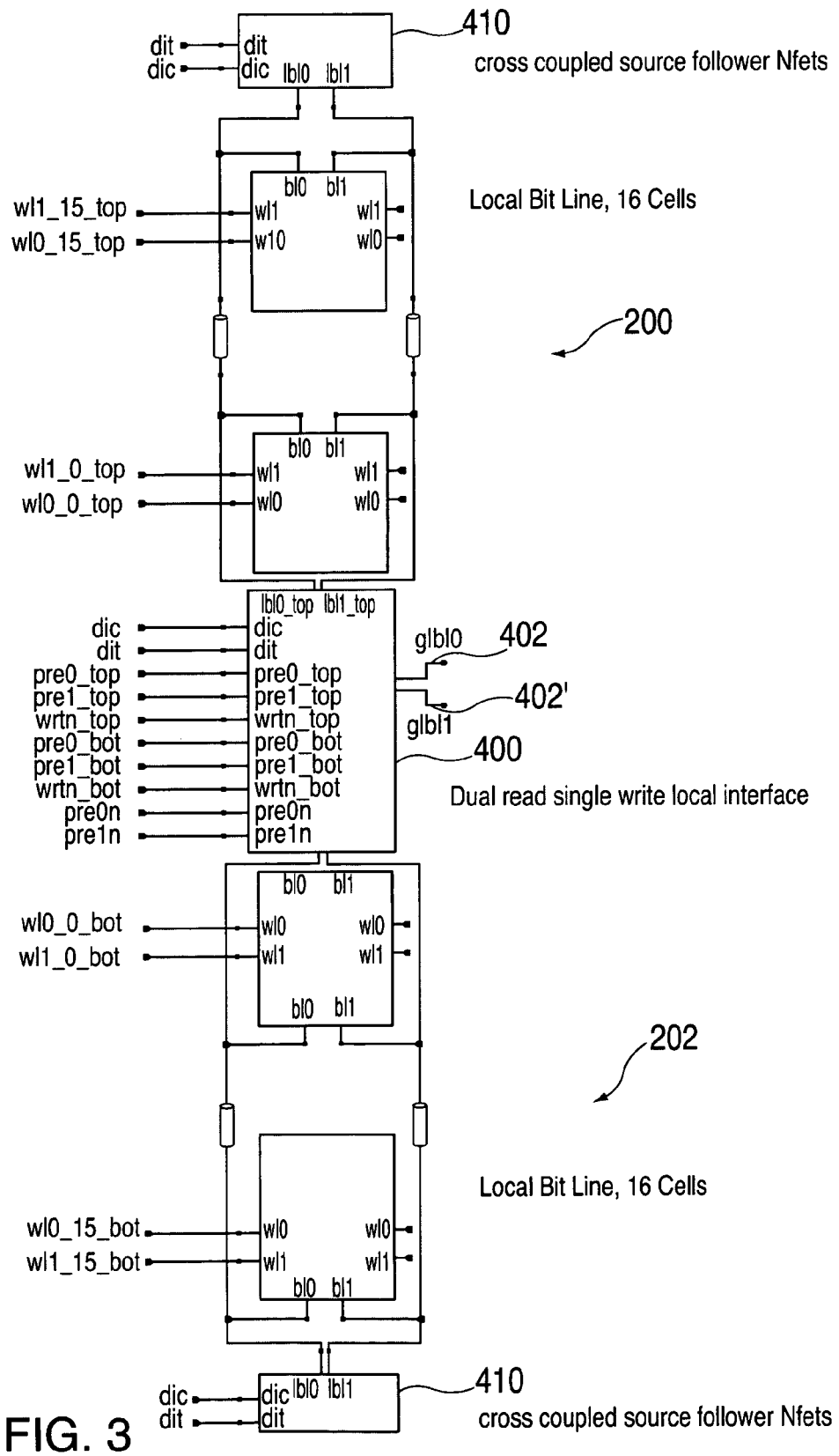
FIG. 3 depicts two cell blocks interfaced at a global bitline interface.

FIG. 3 is a block diagram of a system for interfacing local bitlines to a global bitline. Memory cells from the top sub-array 200 and the bottom sub-array 202 are coupled to a local to global interface 400. In the embodiment show in FIG. 3, the memory array is configured as a dual read, single write memory array. Thus, the local to global interface 400 outputs two global bitlines 402 and 402' corresponding to reads on port 0 or port 1. FIG. 3 shows the local to global interface 400 receiving the local precharge top (pre0_top, pre1_top), local precharge bottom (pre0_bot, pre1_bot), write enable top (wrtn_top), write enable bottom (wrtn_bot) and precharge signals (pre0n, pre1n). Certain signals are designated with a 0 or 1 indicating the port to which the signal applies. Also shown in FIG. 3 is a data in true signal, labeled dit, and a data in compliment signal, labeled dic. Data in true and data in compliment are used to write to a memory cell.

Figure 4:
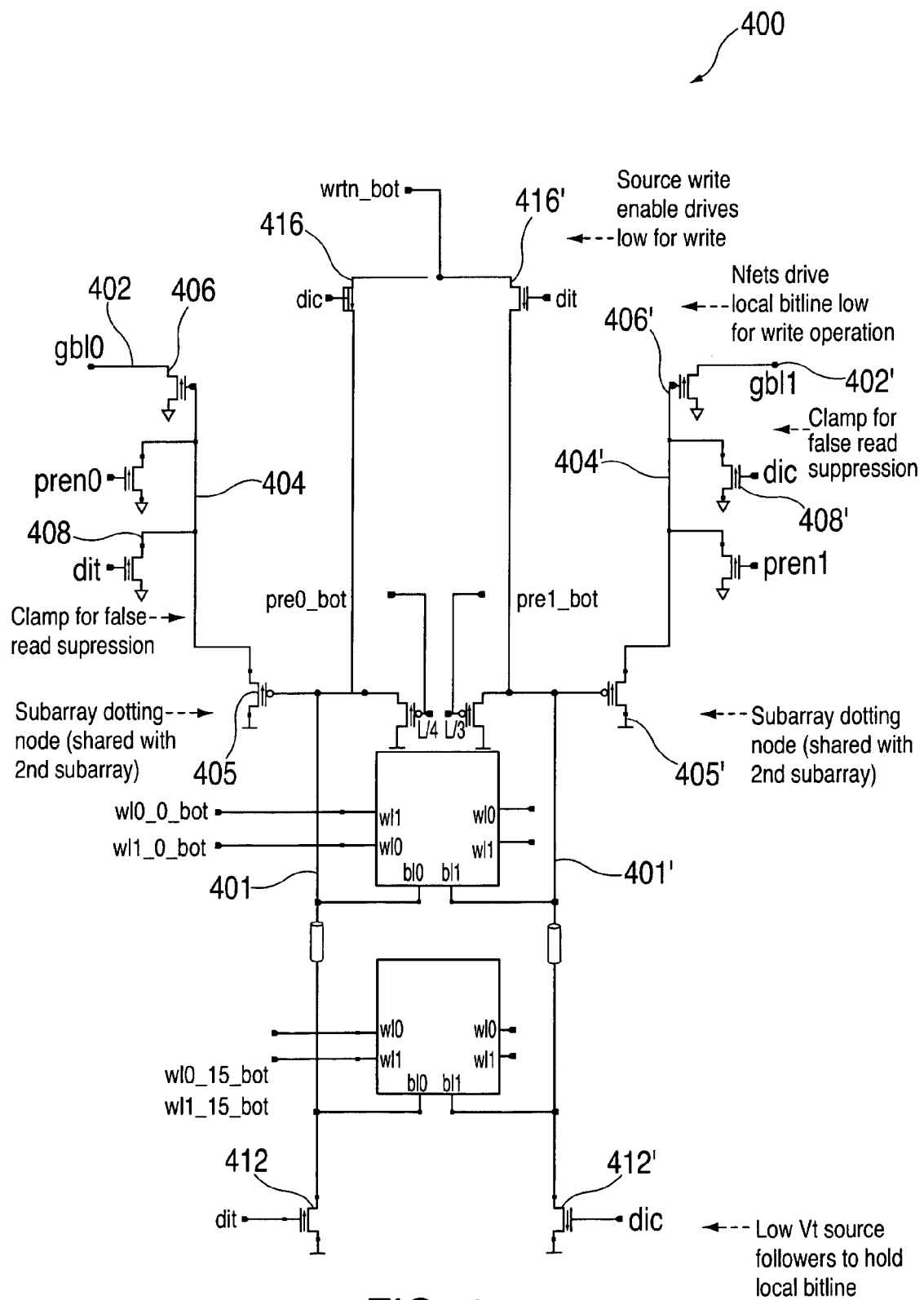
FIG. 4 depicts a local bitline data driver in an exemplary embodiment.

FIG. 4 depicts a local to global bitline interface 400 for the bottom sub-array 202 in an exemplary embodiment. A similar circuit is provided for the top sub-array. As the local to global interface 400 supports dual read, there are two global bitlines 402 and 402'. There are a number of components to suppress false reads during a write operation. Global bitlines 402 and 402' are coupled to interface lines 404 and 404' through NFET global interface devices 406 and 406'. Interface lines 404 and 404' are coupled to NFET clamp devices 408 and 408' having gates coupled to data in signals dit and dic, respectively. Interface lines 404 and 404' are coupled to local bitlines 401 and 401' through PFET local bitline devices 405 and 405' having source nodes coupled to a voltage and a drain node coupled to the respective interface line 404 or 404'. When either dit or dic is high, this pulls interface line 404 or 404' to ground turning off global interface device 406 and 406' preventing a false read on global bitlines 402 and 402'.

As shown in FIG. 3, the circuitry includes local bitline hold units 410. These local bitline hold units 410 drive local bitlines to provide recovery from fast/early reads on local bit lines and help hold local bit lines high to accommodate for droop caused by leakage/noise. The embodiment show in FIG. 4 uses data driven low threshold voltage source follower NFET bitline hold devices 412 and 412' to provide for early read recovery and noise suppression during a write operation. The gates of the NFET bitline hold devices 412 and 412' are coupled to receive dit and dic, respectively. The source of the NFET bitline hold devices 412 and 412' is coupled to a separate higher voltage power supply than is used for the local bitline, such that when dit or dic is high, the corresponding local bitline 401 and 401' is held high. This higher power supply, coupled with the low voltage of the NFET bitline hold devices 412 and 412' of the source followers provide better clamping of the quiet local bitline during a write operation than would occur if the bitline hold unit were powered by the same voltage as used for the local bit lines.

Figure 5:
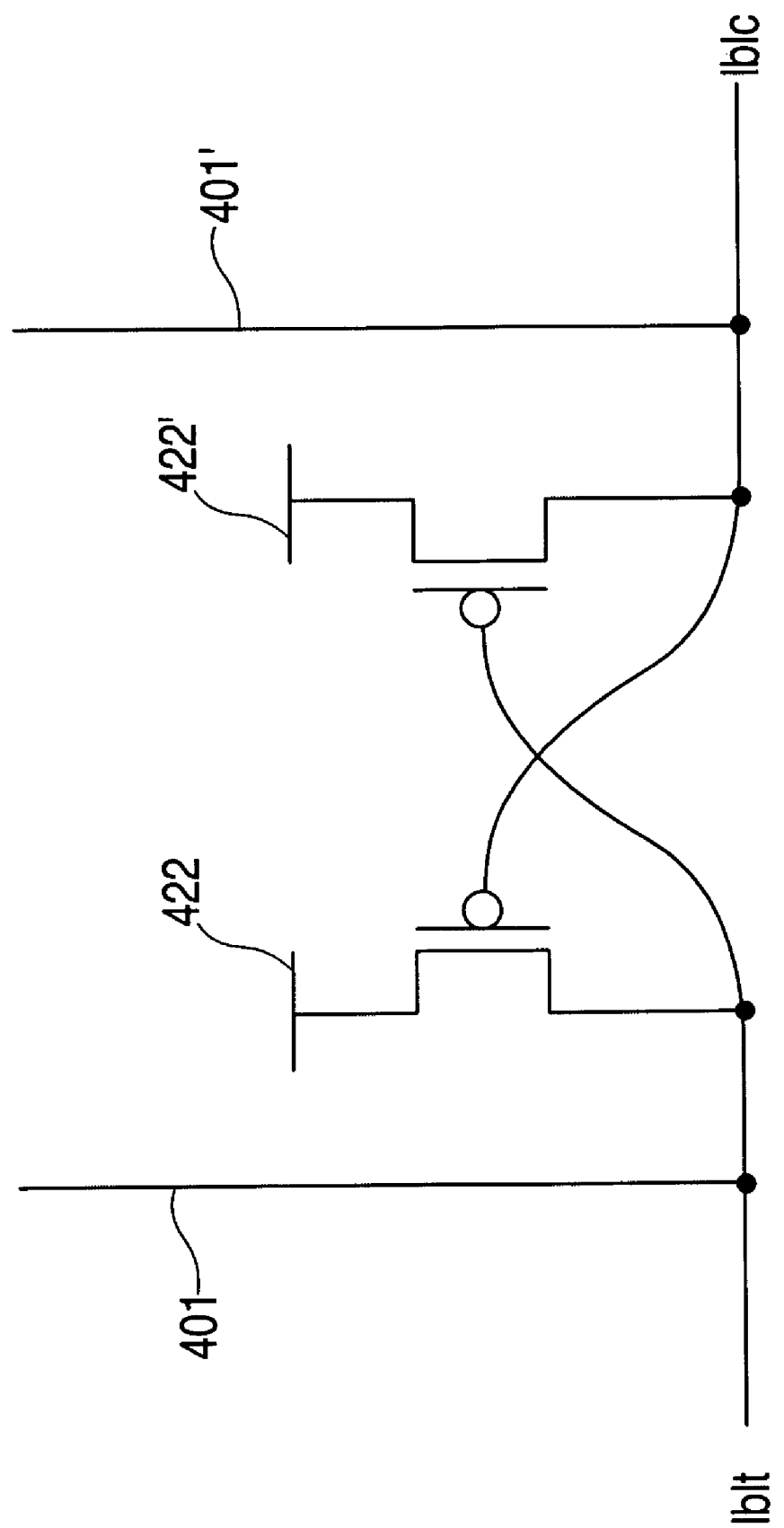
FIG. 5 depicts a local bitline hold unit in an alternate embodiment.

If the memory array is configured for single read, rather than the dual read as shown in FIG. 4, then the local bitline hold units 410 use cross-coupled PFET bitline hold devices coupled to the local bitlines for early read recovery and noise suppression during a write operation. As shown in FIG. 5, cross-coupled PFET bitline hold devices 422 and 422' are coupled to the local bitlines 401' and 401, respectively.

The circuit of FIG. 4 also includes a write enable circuit having two NFET write enable devices 416 and 416'. The write enable signal, wrtn_top, is applied to the source node of the NFET write enable devices 416 and 416'. The gate nodes of the write enable devices 416 and 416' are coupled to the dic and dit signals, respectively. The write enable signal drives the sources of the write enable devices 416 and 416' that control the pull down of the local bitline. This permits disabling of the write drive on an individual sub-array basis without adding additional devices in the area critical local bitline interface circuitry. By driving only the selected sub-array low for write, the capacitance on the dual ended data lines is reduced which improves the write performance over alternate designs which have the write enable signal replaced by the ground supply or stacked NFET enable device.

Embodiments of the invention provide a number of components to suppress false reads during a write operation. A number of devices are driven by the data in signals to prevent a false read from occurring during a write operation. As noted above, embodiments of the invention apply to both single read and dual read memory arrays.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A circuit for interfacing local bitlines to a global bitline, the circuit comprising:

an interface line coupled to a local bitline through a local bitline device;

a global output device having an input coupled to the interface line and an output coupled to the global bitline; and a clamping device coupled to the interface line, the clamping device coupling the interface line to ground in response to a data in signal.

2. The circuit of claim 1 further comprising:

a local bitline hold unit coupled to the local bitline, the local bitline hold unit driving the local bitline high in response to the data in signal.

3. The circuit of claim 2 wherein:

the local bitline hold unit includes an NFET bitline hold device having a source node coupled to a voltage source, a drain node coupled to the local bit line and a gate node receiving the data in signal.

4. The circuit of claim 2 wherein:

the local bitline hold unit includes a PFET bitline hold device having a source node coupled to a voltage source, a drain node coupled to the local bit line and a gate node coupled to the complement local bit line.

5. The circuit of claim 1 further comprising:

a write enable circuit having a write enable device, the write enable device having a source node receiving a write enable signal, a gate node receiving the data in signal and a drain node coupled to the local bitline.

6. The circuit of claim 1 wherein:

the bitline device is a PFET bitline device having a source node coupled to a voltage, a drain node coupled to the interface line and a gate node coupled to the local bitline.

7. A memory comprising:

a memory array having a plurality of cells coupled to bitlines; and a circuit for interfacing local bitlines to a global bitline, the circuit including:

an interface line coupled to a local bitline through a local bitline device;

a global output device having an input coupled to the interface line and an output coupled to the global bitline; and a clamping device coupled to the interface line, the clamping device coupling the interface line to ground in response to a data in signal.

8. The memory of claim 7 further comprising:

a local bitline hold unit coupled to the local bitline, the local bitline hold unit driving the local bitline high in response to the data in signal.

9. The memory of claim 8 wherein:

the local bitline hold unit includes an NFET bitline hold device having a source node coupled to a voltage source, a drain node coupled to the local bit line and a gate node receiving the data in signal.

10. The memory of claim 8 wherein:

the local bitline hold unit includes a PFET bitline hold device having a source node coupled to a voltage source, a drain node coupled to the local bit line and a gate node coupled to the complement local bit line.

11. The memory of claim 7 further comprising:

a write enable circuit having a write enable device, the write enable device having a source node receiving a write enable signal, a gate node receiving the data in signal and a drain node coupled to the local bitline.

12. The memory of claim 7 wherein:

the bitline device is a PFET bitline device having a source node coupled to a voltage, a drain node coupled to the interface line and a gate node coupled to the local bitline.

* * * * *